United States Patent [19]

Pryor et al.

[11] Patent Number: 4,743,299

[45] Date of Patent: May 10, 1988

[54] CERMET SUBSTRATE WITH SPINEL ADHESION COMPONENT

[75] Inventors: Michael J. Pryor, Woodbridge; Eugene Shapiro, Hamden; Deepak Mahulikar, Meriden, all of Conn.

[73] Assignee: Olin Corporation, New Haven, Conn.

[21] Appl. No.: 838,967

[22] Filed: Mar. 12, 1986

[51] Int. Cl.[4] .................... C22C 29/12; H02G 13/08
[52] U.S. Cl. ........................ 75/235; 75/244; 174/52 R
[58] Field of Search ............ 75/232, 233, 234, 235, 75/249, 244; 174/52 R

[56] References Cited

U.S. PATENT DOCUMENTS

| | | | |
|---|---|---|---|
| 2,966,732 | 1/1961 | Towner et al. | 75/249 |
| 2,994,947 | 8/1961 | Towner et al. | 75/249 |
| 3,437,468 | 4/1969 | Sevfert | 75/235 |
| 3,676,292 | 7/1972 | Pryor et al. | |
| 3,726,987 | 4/1973 | Pryor et al. | |
| 3,728,177 | 4/1973 | Caule . | |
| 3,791,800 | 2/1974 | McGee | 75/249 |
| 3,816,080 | 6/1974 | Bomford et al. | 75/249 |
| 3,877,884 | 4/1975 | Tawarada et al. | 75/249 |
| 4,149,910 | 4/1979 | Popplewell . | |
| 4,330,599 | 5/1982 | Winter et al. | |
| 4,362,262 | 12/1982 | Winter et al. | |
| 4,410,927 | 10/1983 | Butt . | |
| 4,429,022 | 1/1984 | Breedis et al. | |
| 4,461,924 | 7/1984 | Butt . | |
| 4,480,262 | 10/1984 | Butt . | |
| 4,491,622 | 1/1985 | Butt . | |
| 4,498,121 | 2/1985 | Breedis et al. | |
| 4,500,028 | 2/1985 | Breedis et al. | |
| 4,500,605 | 2/1985 | Fister et al. | |
| 4,521,469 | 6/1985 | Butt et al. | |
| 4,524,238 | 6/1985 | Butt . | |
| 4,525,422 | 6/1985 | Butt et al. | |
| 4,532,106 | 7/1985 | Pickens | 75/233 |
| 4,532,222 | 7/1985 | Butt . | |
| 4,542,259 | 9/1985 | Butt . | |
| 4,569,692 | 2/1986 | Butt | 75/235 |
| 4,570,337 | 2/1986 | Butt . | |
| 4,577,056 | 3/1986 | Butt . | |
| 4,592,781 | 6/1986 | Cherey et al. | 75/249 |
| 4,594,770 | 6/1986 | Butt . | |
| 4,597,792 | 7/1986 | Webster | 75/249 |
| 4,607,276 | 8/1986 | Butt . | |
| 4,625,400 | 12/1986 | Fister . | |
| 4,649,083 | 3/1987 | Fister et al. | |
| 4,656,499 | 4/1987 | Butt . | |
| 4,659,404 | 4/1987 | Butt . | |

FOREIGN PATENT DOCUMENTS

| | | | |
|---|---|---|---|
| 56-116851 | 9/1981 | Japan | 75/249 |
| 57-57855 | 4/1982 | Japan | 75/249 |
| 60-50137 | 3/1985 | Japan | 75/249 |

OTHER PUBLICATIONS

"A Method for Fabrication of Aluminum-Alumina Composites", by B. F. Quigley et al., American Society for Metals and the Metallurgical Society of AIME, Metallurgical Transactions A, vol. 13A, Jan. 1982.

Primary Examiner—John F. Terapane
Assistant Examiner—Eric Jorgensen
Attorney, Agent, or Firm—Gregory S. Rosenblatt; Paul Weinstein

[57] ABSTRACT

The present invention is directed to a cermet material comprising a matrix of aluminum alloy with ceramic particles distributed therein. The cermet is adapted for use as a semiconductor substrate and is manufactured using powder technology procedures. The cermet comprises from about 40 to about 60 volume % of aluminum or aluminum alloy, from an effective amount up to about 10 volume % of binder for enhancing bonding between the aluminum alloy and ceramic particles, and the balance essentially ceramic particles.

9 Claims, 1 Drawing Sheet

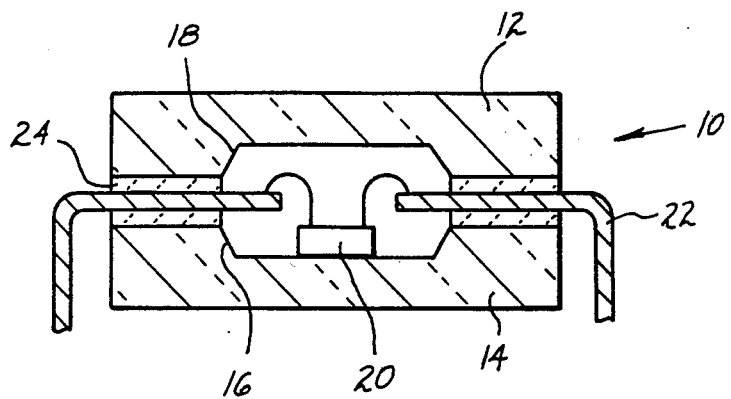

CERMET SUBSTRATE WITH SPINEL ADHESION COMPONENT

This application relates to U.S. Pat. No. 4,569,692, entitled "Low Thermal Expansivity and High Thermal Conductivity Substrate" by S. H. Butt and U.S. patent application Ser. No. 838,866 entitled "Cermet Substrate With Glass Adhesion Component" by D. Mahulikar, filed Mar. 12, 1986 (now abandoned).

While the invention is subject to a wide range of applications, it is especially suited for use as a substrate for microelectronics. The invention is primarily directed to bonding together materials having different thermal expansivities and thermal conductivities to form a coherent composite with improved rigidity and thermal performance.

Low expansivity materials are widely used in the microelectronic industry as substrate materials for semiconductor packages, multi-device hybrid circuit packages, chip carriers and printed circuit boards. The latter applications are particularly useful when the coefficient of thermal expansion of the substrate is critical, i.e. when silicon chips or low expansivity leadless chip carriers are mounted directly to the substrate.

In many instances, state of the art, low expansivity, ceramic and metallic substrate materials may be replaced by relatively high expansivity metals. Generally, high expansivity metallic materials are used in combination with appropriately selected high expansivity glasses or organic adherents. The mismatch in the coefficient of thermal expansion (CTE) between these combinations of materials and the low CTE silicon based microelectronic components is accommodated by mounting systems such as adhesives or solders which prevent the development of unacceptably high thermal stresses within the typically fragile and brittle semiconductor components. An example of such a die attach system is disclosed in U.S. patent application Ser. No. 826,808, filed Feb. 10, 1986 by M. J. Pryor et at. for "Semiconductor Die Attach System". However, it may not be feasible to provide component mounting systems which can accommodate the potential thermal stresses developed due to the significant mismatch between high CTE metal substrates and the low CTE semiconductor chips. To better appreciate the advantages of the unique materials of the present invention, the limitations of conventional substrate materials are enumerated in the following text.

Alumina ceramics are presently the most widely used of the substrate materials. There is a moderate mismatch between the coefficients of thermal expansion of alumina and the semiconductor chip. This mismatch generally does not create unacceptably high stresses on a chip mounted to an alumina substrate when subjected to thermal cycling. The mismatch is usually acceptable even when the chip sizes are quite large or when the chip is rigidly adhered to the substrate. Alumina ceramics are particularly attractive since they are less costly than most other low expansivity substrate materials. However, there are a number of drawbacks to alumina such as poor thermal conductivity, i.e. in the range of about 10 to about 20 watts per meter kelvin (W/m-°K.). Also, manufacturing capabilities limit alumina substrate areas to less than about 50 sq. in.

Beryllia ceramics, having a rather high thermal conductivity of about 190 W/m-°K., replace alumina ceramics in special applications. The inherent high cost of beryllium results in these substrates being very expensive. A further disadvantage of beryllia substrates is its toxicity requiring cautious handling and very careful dust control. However, even with high material costs, high processing costs and toxicity control problems, beryllia substrates are often used when enhanced thermal conductivity is required.

Molybdenum strip metal, having a thermal conductivity of about 142 W/m-°K. is sometimes used as a substrate material, particularly in hybrid circuit packages. Although expensive and difficult to process, molybdenum does provide high thermal conductivity in association with a low coefficient of thermal expansion, i.e. about $49 \times 10^{-7}$ in/in/°C. A serious drawback to the use of molybdenum components is the particular difficulty in processing because of its poor oxidation resistance.

Clad metals for low expansivity substrates generally include a high conductivity, high thermal expansivity copper or copper alloy clad to a very low thermal expansivity nickel-iron alloy (such as INVAR) core. The resulting composite has a coefficient of thermal expansion comparable to that of alumina and beryllia ceramics. The purpose of cladding with copper or copper alloy is to improve the relatively poor thermal conductivity of nickel-iron alloys. However, the improved thermal conductivity is primarily in a plane extending through the length and width of the substrate. At the same time, thermal conductivity through the thickness of the composite metal, primarily comprising the nickel-iron alloy core, remains relatively low. The cost of the nickel-iron alloys and the relatively costly process involved in manufacturing clad metals results in these substrate materials being relatively expensive although still less costly than comparable beryllia or molybdenum substrates.

The present invention is directed to composite materials called cermets. As the term indicates, they include mixtures of metals and ceramics. The advantage of this material over comparably sized metal substrate is its increased rigidity and lighter weight. As compared to ceramic substrates, it has a much higher coefficient of thermal expansion and thermal conductivity and can be electrically conductive. Also, the cermets are fabricated at a much lower temperature than that required for ceramic sintering, i.e. about 1600° C. and the processing cost is typically lower. Further, the CTE and the thermal conductivity of the cermet can be selected over a relatively large range of values. The problem has been that up until now these materials were not easily bonded together to form a rigid structure as required for electronic applications.

A process of producing aluminum-alumina composites has been described in an article entitled "A Method for Fabrication of Aluminum-Alumina Composites" by B. F. Quigley et al., American Society For Metals And The Metallurgical Society Of AIME, Metallurgical Transactions A, Volume 13A, Jan. 1982. This article discloses that alumina fibers can be incorporated in Al-Mg matrices and that complete wetting and bond formation are achieved. The process incorporates casting technology whereby the ceramic fibers are mixed into molten Al-Mg. Then about 50 to about 70 percent of the aluminum is squeezed out of the mixture through a ceramic filter. The resulting mixture has a maximum of about 23 vol. % of alumina particles in a matrix of Al-Mg. The article also stated that substantial fiber breakage occurred when the fibers in the starting material was at a level of about 10 to 20 vol. %. Therefore, the breakage was kept to a minimum by compressing composite material containing fibers in the range of 5 to 10 vol. percent. This article describes a process which is quite different from that of the present invention. First of all, the present invention uses powder metallurgy technology and is thereby able to achieve substantially higher percent volumes of ceramic particles within the alloy matrix. These higher volumes are extremely important for adjusting the coefficient of thermal expansion of the mixture to be compatible with that of copper alloy material which is typically used for leadframe construction in semiconductor packaging applications. Also, the amount of alloying particles being added to the aluminum is within a restricted range in order that the thermal conductivity of the final composite is high. The size of the ceramic particles is also kept very small in order that the resulting composite will have a smooth finish in order that it be suitable for electronic applications.

It is a problem underlying the present invention to manufacture a rigid cermet having a relatively high coefficient of thermal expansion and a relatively high thermal conductivity.

It is an advantage of the present invention to provide a composite which obviates one or more of the limitations and disadvantages of the described prior arrangements.

It is a further object of the present invention to provide a composite and method of forming the composite which has a CTE that is closely matched to that of a metallic leadframe.

It is a still further advantage of the present invention to provide a composite and method of forming the composite which is adapted to be a substrate that is both rigid and able to withstand thermal shock resistance.

It is another advantage of the present invention to provide a composite and method of forming the composite which is highly thermally conductive.

It is a yet further advantage of the present invention to provide a composite and method of forming the composite which is relatively inexpensive to manufacture.

Accordingly, there has been provided a cermet material which is adapted for use as a semiconductor substrate. The cermet is a composite preferably formed using powder technology procedures. The composite consists essentially of a mixture of from about 40 to about 60 volume % of aluminum or aluminum alloy, from an effective amount up to about 10 volume % of binder for enhancing bonding between the alumina and ceramic particles, and the balance essentially ceramic particles. The composite material has a matrix comprising the aluminum alloy with the alloying material and the ceramic particles are distributed therein.

IN THE DRAWING

The FIGURE is a semiconductor package formed of a cermet base and cover in accordance with the present invention.

The present invention is particularly directed to cermets having a relatively high coefficient of thermal expansion and a relatively high thermal conductivity. These cermets are manufactured from relatively inexpensive materials using powder metallurgy techniques. The resulting cermets are adapted for use as substrates for semiconductor devices, hybrid packages or rigid printed circuit boards. The basic concept involves mixing ceramic particles with aluminum or aluminum alloy particles and heat treating the mixture so that the resulting cermet has the ceramic particles distributed within an aluminum matrix. The ceramic material has a low coefficient of thermal expansion, a high elastic modulus and generally exhibits poor thermal conductivity. By contrast, the aluminum is a highly thermal conductive material with a high coefficient of thermal expansion. The production of this cermet is severely limited by the inability of liquid aluminum to wet the ceramic particles. The present invention is directed to a new method of fabricating aluminum or aluminum alloy ceramic composites which involves the addition of binder to the aluminum or aluminum alloy matrix for enhancing bonding between the aluminum or aluminum alloy particles and the ceramic particles. This binder forms a spinel of the binder and the ceramic at the interface between the matrix and the ceramic particles to chemically bond the ceramic particles within the aluminum alloy matrix.

The ceramic particles are preferably aluminum oxide ($Al_2O_3$) but may be any other ceramic particles such as for example Al N and $Si_3N_4$ and mixtures thereof. The $Al_2O_3$ (alumina) particles are particularly desirable because they are readily available, inexpensive and have a coefficient of thermal expansion and compressive elastic modulus in a desired range. The ceramic particles have a size between about 10 to about 40 microns and preferably between about 15 to about 25 microns. The upper limit of the ceramic particles is chosen because the finished product requires a relatively smooth finish in order to meet the standards for electronic packaging. If the composite were used for an application other than electronic packaging, the ceramic particles may be of any size greater than about 10 microns. The volume % of the ceramic particles is determined after the volume % of the aluminum and the binder has been selected so that the final composite has essentially up to about 10 volume % of the binder. Typically, the amount of ceramic is selected to adjust the final composite in accordance with the required coefficient of thermal expansion. As the amount of ceramic is reduced, the coefficient of thermal expansion of the composite is raised.

The composite material also contains from about 30 to about 65 volume % of particles consisting essentially of aluminum or aluminum alloy. Preferably, the aluminum or aluminum alloy particles make up about 40 to about 60 volume % of the composite. This volume % is selected in order that the final composite material has a relatively high coefficient of thermal expansion of between about $140 \times 10^{-7}$ to about $170 \times 10^{-7}$ in/in/°C. and preferably between about $150 \times 10^{-7}$ to $165 \times 10^{-7}$ in/in/°C. This high volume % of aluminum or aluminum alloy may result in the final composite being electrically conductive. This is advantageous to provide an EMI shield and to prevent static shock.

The aluminum or aluminum alloy particles are sized between about 3 to about 25 microns. Preferably, the aluminum or aluminum alloy particles are sized from about 5 to about 10 microns. The lower size limit of the aluminum or aluminum alloy particles is established in order to maintain the oxide addition at a low level. Very small particles, such as below about 5 microns, are easily oxidized and result in an undesirably high oxygen content in the mixture. At the same time, it is preferably to use relatively small aluminum or aluminum alloy particles in order that the final density of the composite is relatively high such as above about 96% of the theoretical density. This is important in applications requiring hermetic components where significant porosity can not be tolerated. The aluminum itself has a coefficient of thermal expansion of about $230 \times 10^{-7}$ in/in/°C. and a thermal conductivity of about 270 W/m-°K.

The aluminum or aluminum alloy particles are selected to be smaller than the ceramic particles because the aluminum is deformable while ceramic is relatively undeformable. This can be understood from the following remarks. Assuming that a mixture of powder is formed of spheres of one size, the interstices or voids between adjacent spheres allow a maximum of 65% theoretical packing without any deformation. If a mixture of powder comprising two different materials are packed together and one of the materials is composed of particles which are larger or coarser than the other, the finer particles can be disposed in the interstices between the larger particles. In the present case, it is preferably that the larger particles are ceramic non-deformable particles. Then the smaller aluminum or aluminum alloy particles are deformable and can be packed into the interstices to achieve maximum densification.

The composite of an aluminum or aluminum alloy matrix containing high strength ceramic particles is ideal for substrate applications. However, production of this composite is severely limited by the inability of the liquid aluminum to wet the ceramic fibers. The absence of adhesion within this type of system was illustrated by the following test. Five micron size aluminum powder was thoroughly mixed with about 30 micron size $\alpha$-$Al_2O_3$. The aluminum powder made up approximately 40 volume % of the mixture and the balance was the $\alpha$-$Al_2O_3$. The powder was then compacted into cylinders using about 15 to about 25 tons of pressure. The green density of the compact was about 88%. The compacts were then degassed at about 400° C. and sintered at about 600° C. for 24 hours. The sintered density of the compact was about 92%. The compressive elastic modulus of the sintered compact was about $7 \times 10^6$ psi. Fractographic studies were carried out and indicated that no Al-$Al_2O_3$ adhesion was achieved. The inability for the liquid metal to wet the alumina particles has previously been indicated in the literature as mentioned in the article by Quigley et al. described in the background of this invention.

The present invention adds an effective amount up to about 10 volume % of binder for enhancing bonding between the aluminum alloy matrix and the ceramic particles. The binder may be added in particle form sized between about 3 to about 25 microns. Preferably the particles are sized from about 5 to about 10 microns. The binders are preferably selected from the group consisting of Mg, Li, Cr, Ca, Be, MgO and mixtures thereof. The effective ranges in volume % are thought to be about 0.5 to about 10 volume % of Mg and preferably about 2 to 6 volume % of Mg. The effective ranges of the remaining components are about 1 to about 5 volume % Li, about 0.05 to about 3 volume % Cr, about 0.05 to about 1 volume % Ca, about 0.05 to about 0.5 volume % Be, and about 1 to about 5 volume % MgO.

The magnesium is thought to be the preferred addition to the aluminum because it is not reactive with the aluminum and is relatively inexpensive. The magnesium diffuses into the aluminum and reduced its thermal conductivity by a significant amount. For example, referring to Chart 1, an 8% addition of magnesium significantly lowers the thermal conductivity as compared with a 1% addition of magnesium to the aluminum.

| CHART I | |
|---|---|
| Material | Thermal Conductivity Watts/Meter °K. |
| Aluminum | 270 |
| Ceramic | 10-20 |
| Copper | 380 |
| Copper Alloy (CDA 72400) | 45 |
| Aluminum + 1% Mg | 220 |
| Aluminum + 8% Mg | 140 |

It is clear from Chart I that the amount of magnesium added to mixture is preferably kept low in order to increase the thermal conductivity of the cermet material. The final thermal conductivity of the cermet material is between about 40 to 120 W/m-°K. Preferably, the range is about 50 to about 100 W/m-°K. and most preferably between about 60 and about 80 W/m-°K.

Another important characteristic of the cermet material is its high coefficient of thermal expansion which is in the range of about $140 \times 10^{-7}$ to about $170 \times 10^{-7}$ in/in/° C. and preferably in the range of about $150 \times 10^{-7}$ to about $165 \times 10^{-7}$ in/in/°C. This range may be selected to prevent any significant CTE mismatch to copper alloy material which is the preferred material for leadframe applications. For example, the coefficient of thermal expansion of CDA 72400 is about $170 \times 10^{-7}$ in/in/°C.

The binder creates a chemical bond at the interface of the particulate ceramic and the aluminum alloy during solid or liquid phase sintering. The bond is through a spinel such as $MgO.Al_2O_3$. The strong chemical bond formed by the spinel bonding to both the alumina and the aluminum magnesium alloy enables transfer of either mechanical or thermal loads so that the composite achieves the rule of mixture properties.

The final cermet or composite exhibits the beneficial combination of high compressive elastic modulus, high thermal conductivity and high coefficient of thermal expansion which are particularly important in semiconductor applications. An important characteristic of the cermet is its high compressive modulus. The final compact has a compressive modulus of at least about $20 \times 10^6$ psi. This high compressive modulus results in excellent mechanical integrity of the final cermet and rigidity of a semiconductor package when the material is employed as shown for example in the Figure.

The process of forming the cermet of the present invention preferably applies powder metallurgy technology. A mixture is formed of from about 40 to about 60 volume % of aluminum or aluminum alloy particles having a size from about 3 to about 25 microns. Then an effective amount up to about 10 volume % of binder in the form of particles sized between about 3 to about 25 microns for enhancing bonding between the aluminum or aluminum particles and the ceramic particles is added. The binder is selected from the group consisting of Mg, Li, Cr, Ca, Be, MgO and mixtures thereof. Then the balance of the mixture to form 100 volume % is ceramic particles having a size from about 10 to about 40 microns. The ceramic particles are selected from the group consisting of AlN, $Si_3N_4$, $Al_2O_3$ and mixtures thereof. The mixture is thoroughly blended and compacted using a pressure of between about $15 \times 10^6$ to about $100 \times 10^6$ psi and preferably between about $40 \times 10^6$ to about $60 \times 10^6$ psi. Then, the compact is preferably degassed at a temperature of about 300° C. to about 650° C. for about 1 hour. This step is typically required because aluminum powders are usually coated with a lubricant such as stearic acid which must be vaporized and removed from the compact. Finally, the compact is heat treated by a process such as sintering at a temperature range of about 600° C. to about 750° C. for about 8 to about 100 hours. The sintering may be done in the solid state below about 660° C. and in the semi-solid state at a temperature above about 660° C. In either case, it is preferably accomplished within 24 hours and within an inert or reducing atmosphere such as nitrogen, nitrogen- 4% hydrogen or argon. When the sintering is done in the semi-solid state, the binder may be added as MgO.

An example of the process for forming a cermet includes mixing 30 to 100 micron size $\alpha$-$Al_2O_3$ powder with 5 micron size magnesium powder. The mixture was then blended with three micron size aluminum powder. The volume fraction of the aluminum powder was about 35% and that of the magnesium powder was about 6%, and the remainder $Al_2O_3$. The mixture was compacted using about 30,000 pounds of pressure. Then the compacts were degassed and sintered at about 600° C. for 24 hours. The compressive elastic modulus was measured as being between about $24 \times 10^6$ to about $27 \times 10^6$ psi. Further processing such as hot pressing or hot forging may be applied to increase densification and improve properties.

Referring to the FIGURE, a semiconductor casing 10 is illustrated. The lid 12 and the base 14 are formed of a cermet in accordance with the present invention. A cavity 16 and 18 of any desired shape may be formed in the base and lid to accommodate the semiconductor device 20. A leadframe 22, preferably copper alloy, is disposed between the base and cover. A glass 24 having a high coefficient of thermal expansion may preferably be used to hermetically seal the package 10. A suitable glass may be lead borate type sealing glasses including additives of either calcium fluoride or barium fluoride to increase the coefficient of thermal expansion to match that of the copper alloy lead frame. Further, it may be desirable to add small amounts of copper oxide to the glass to strengthen the bond to the copper alloy leadframe. The modified glass and its application for hermetically sealing a semiconductor casing is set out in U.S. patent application Ser. No. 651,986 to Pryor et al. The leadframe is preferably formed of a copper base alloy such as CDA 72400 which can form a strong bond to the sealing glass and have good softening resistance when exposed to high temperatures. It is also within the terms of the present invention to use other glass sealable alloys such as CDA 63800. Both of these alloys and the glass have a coefficient of thermal expansion in the range of about $160 \times 10^{-7}$ to about $170 \times 10^{-7}$ in/in/°C. This favorably compares to the coefficient of thermal expansion which can be achieved using a cermet formed in accordance with the present invention.

The patents, patent applications and articles set forth in this application are intended to be incorporated by reference herein.

It is apparent that there has been provided in accordance with this invention a composite material adapted for use as a semiconductor substrate which satisfies the objects, means and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications and all variations as fall within the spirit and broad scope of the appended claims.

What is claimed is:

1. A composite material for a component for a package to encase an electronic device, comprising:
   an aluminum or aluminum alloy forming a matrix of said composite material;
   ceramic particles distributed within said matrix; and
   a spinel comprising the interface between the matrix and the ceramic particles, said spinel being chemically bonded both to said aluminum or aluminum alloy matrix and to said ceramic particles, said spinel comprising said ceramic and a binder selected from the group consisting of Mg, Li, Cr, Ca, Be, MgO and mixtures thereof;
   said composite material further comprising:
   from about 50 to about 65 volume % of said aluminum or aluminum alloy, an effective amount of up to about 10 volume % of said binder, and the balance essentially said ceramic particles; and
   said composite material having a thermal conductivity of about 40 to about 120 W/m-°K. for improved heat transfer through said component.

2. The composite material of claim 1 wherein said binder is selected from the group selected of about 0.5 to about 10 volume % of magnesium, about 1 to about 5 volume % lithium, about 0.05 to about 3 volume % chromium, about 0.05 to about 1% calcium, about 0.05 to about 0.5 volume % beryllium, about 1 to about 5 volume % MgO and mixtures thereof.

3. The composite material of claim 2 including said ceramic particles being $Al_2O_3$.

4. The composite material of claim 3 wherein said binder is about 2 to about 6 volume % Mg, and said spinel being $MgO.Al_2O_3$.

5. The composite material of claim 1 further including said ceramic particles being selected from the group consisting of AlN, $Si_3N_4$, $Al_2O_3$ and mixtures thereof.

6. The composite material of claim 5 including said ceramic particles having a size between about 10 to about 40 microns.

7. The composite material of claim 1 wherein said composite material is formed into a base component and a lid component of said package.

8. The composite material of claim 7 further including said base and lid components being stacked on each other,
   a leadframe having a coefficient of thermal expansion of about $160 \times 10^{-7}$ to about $170 \times 10^{-7}$ in./in./°C. being disposed between said base and lid components;
   a sealing glass bonding the lid and base components to each other to hermetically seal said package; and
   said base and lid components having a coefficient of thermal expansion which is compatible with the coefficient of thermal expansion of said leadframe.

9. The composite material of claim 1 having a coefficient of thermal expansion of between about $140 \times 10^{-7}$ to about $170 \times 10^{-7}$ in./in./°C. and a compressive elastic modulus of at least about $20 \times 10^6$ psi.

* * * * *